(12) United States Patent
Susuki

(10) Patent No.: US 6,320,814 B1
(45) Date of Patent: Nov. 20, 2001

(54) SEMICONDUCTOR DEVICE

(75) Inventor: Masato Susuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/633,817

(22) Filed: Aug. 7, 2000

(30) Foreign Application Priority Data

Sep. 30, 1999 (JP) ................................................ 11-278383

(51) Int. Cl.$^7$ ....................................................... G11C 8/00
(52) U.S. Cl. ................................. 365/230.06; 365/230.03
(58) Field of Search ........................ 365/230.03, 230.06, 365/233.5

(56) References Cited

U.S. PATENT DOCUMENTS

| | | | |
|---|---|---|---|
| 5,414,663 | * 5/1995 | Komarek et al. | 365/210 |
| 5,596,545 | * 1/1997 | Lin | 365/236 |
| 5,875,452 | * 2/1999 | Katayama et al. | 365/133 |
| 6,049,490 | * 4/2000 | Kawasumi | 365/189.07 |
| 6,125,078 | * 9/2000 | Ooishi et al. | 365/133 |

FOREIGN PATENT DOCUMENTS

| | | |
|---|---|---|
| 4-243093 | 8/1992 | (JP) . |
| 5-282891 | 10/1993 | (JP) . |

* cited by examiner

*Primary Examiner*—Son T. Dinh
(74) *Attorney, Agent, or Firm*—Arent Fox Kintner Plotkin & Kahn

(57) ABSTRACT

This semiconductor device is equipped with a surplus address detection circuit with a small area and the circuit can be used commonly for various maximum word sizes. The semiconductor comprises a memory for an intermediate word size having X rows or columns, where X is between Nth power of 2 and (N-1)th power of 2, and N is a natural number, an address decoder that decodes address signals addressing rows or columns of the memory for an intermediate word size to be accessed, and a surplus address detection circuit that detects accesses to surplus addresses larger than number X. The address decoder comprises plural pre-decoders that decode address signals classified into plural groups and a post-decoder that generates a selection signal that selects a row or column to be accessed by the combination of outputs of the plural pre-decoders. The surplus address detection circuit detects accesses to surplus addresses larger than number X by the outputs of the plural pre-decoders, and the number of the input signal lines of the surplus address detection circuit is smaller than that of the outputs of the plural pre-decoders, and only a part of the outputs of the plural pre-decoders is supplied to the surplus address detection circuit.

4 Claims, 19 Drawing Sheets

Fig. 7A

| MAX. WORD ROW | e2 | e1 | e0 | d0 | c7 | c6 | c5 | c4 | c3 | c2 | c1 | c0 |
|---|---|---|---|---|---|---|---|---|---|---|---|---|
| 3 | a3 | | | | | | | | | | | |
| /// | /// | /// | /// | /// | /// | /// | /// | /// | /// | /// | /// | /// |
| 5 | a7 | a6 | a5 | | | | | | | | | |
| 6 | a7 | a6 | | | | | | | | | | |
| 7 | a7 | | | | | | | | | | | |
| /// | /// | /// | /// | /// | /// | /// | /// | /// | /// | /// | /// | /// |
| 9 | | | | b1 | a7 | a6 | a5 | a4 | a3 | a2 | a1 | |
| 10 | | | | b1 | a7 | a6 | a5 | a4 | a3 | a2 | | |
| 11 | | | | b1 | a7 | a6 | a5 | a4 | a3 | | | |
| 12 | | | | b1 | a7 | a6 | a5 | a4 | | | | |
| 13 | | | | b1 | a7 | a6 | a5 | | | | | |
| 14 | | | | b1 | a7 | a6 | | | | | | |
| 15 | | | | b1 | a7 | | | | | | | |
| /// | /// | /// | /// | /// | /// | /// | /// | /// | /// | /// | /// | /// |
| 17 | | b3 | b2 | | a7 | a6 | a5 | a4 | a3 | a2 | a1 | |
| 18 | | b3 | b2 | | a7 | a6 | a5 | a4 | a3 | a2 | | |
| 19 | | b3 | b2 | | a7 | a6 | a5 | a4 | a3 | | | |
| 20 | | b3 | b2 | | a7 | a6 | a5 | a4 | | | | |
| 21 | | b3 | b2 | | a7 | a6 | a5 | | | | | |
| 22 | | b3 | b2 | | a7 | a6 | | | | | | |
| 23 | | b3 | b2 | | a7 | | | | | | | |
| 24 | | | b3 | | a7 | a6 | a5 | a4 | a3 | a2 | a1 | a0 |
| 25 | | | b3 | | a7 | a6 | a5 | a4 | a3 | a2 | a1 | |
| 26 | | | b3 | | a7 | a6 | a5 | a4 | a3 | a2 | | |
| 27 | | | b3 | | a7 | a6 | a5 | a4 | a3 | | | |
| 28 | | | b3 | | a7 | a6 | a5 | a4 | | | | |
| 29 | | | b3 | | a7 | a6 | a5 | | | | | |
| 30 | | | b3 | | a7 | a6 | | | | | | |
| 31 | | | b3 | | a7 | | | | | | | |

Fig. 7B

| MAX. WORD ROW | e2 | e1 | e0 | d0 | c7 | c6 | c5 | c4 | c3 | c2 | c1 | c0 |
|---|---|---|---|---|---|---|---|---|---|---|---|---|
| 33 | b7 | b6 | b5 | b4 | a7 | a6 | a5 | a4 | a3 | a2 | a1 | |
| 34 | b7 | b6 | b5 | b4 | a7 | a6 | a5 | a4 | a3 | a2 | | |
| 35 | b7 | b6 | b5 | b4 | a7 | a6 | a5 | a4 | a3 | | | |
| 36 | b7 | b6 | b5 | b4 | a7 | a6 | a5 | a4 | | | | |
| 37 | b7 | b6 | b5 | b4 | a7 | a6 | a5 | | | | | |
| 38 | b7 | b6 | b5 | b4 | a7 | a6 | | | | | | |
| 39 | b7 | b6 | b5 | b4 | a7 | | | | | | | |
| 40 | | b7 | b6 | b5 | a7 | a6 | a5 | a4 | a3 | a2 | a1 | a0 |
| 41 | | b7 | b6 | b5 | a7 | a6 | a5 | a4 | a3 | a2 | a1 | |
| 42 | | b7 | b6 | b5 | a7 | a6 | a5 | a4 | a3 | a2 | | |
| 43 | | b7 | b6 | b5 | a7 | a6 | a5 | a4 | a3 | | | |
| 44 | | b7 | b6 | b5 | a7 | a6 | a5 | a4 | | | | |
| 45 | | b7 | b6 | b5 | a7 | a6 | a5 | | | | | |
| 46 | | b7 | b6 | b5 | a7 | a6 | | | | | | |
| 47 | | b7 | b6 | b5 | a7 | | | | | | | |
| 48 | | | b7 | b6 | a7 | a6 | a5 | a4 | a3 | a2 | a1 | a0 |
| 49 | | | b7 | b6 | a7 | a6 | a5 | a4 | a3 | a2 | a1 | |
| 50 | | | b7 | b6 | a7 | a6 | a5 | a4 | a3 | a2 | | |
| 51 | | | b7 | b6 | a7 | a6 | a5 | a4 | a3 | | | |
| 52 | | | b7 | b6 | a7 | a6 | a5 | a4 | | | | |
| 53 | | | b7 | b6 | a7 | a6 | a5 | | | | | |
| 54 | | | b7 | b6 | a7 | a6 | | | | | | |
| 55 | | | b7 | b6 | a7 | | | | | | | |
| 56 | | | | b7 | a7 | a6 | a5 | a4 | a3 | a2 | a1 | a0 |
| 57 | | | | b7 | a7 | a6 | a5 | a4 | a3 | a2 | a1 | |
| 58 | | | | b7 | a7 | a6 | a5 | a4 | a3 | a2 | | |
| 59 | | | | b7 | a7 | a6 | a5 | a4 | a3 | | | |
| 60 | | | | b7 | a7 | a6 | a5 | a4 | | | | |
| 61 | | | | b7 | a7 | a6 | a5 | | | | | |
| 62 | | | | b7 | a7 | a6 | | | | | | |
| 63 | | | | b7 | a7 | | | | | | | |

Fig.10A

| MAX. WORD ROW | e2 | e1 | e0 | d0 | c7 | c6 | c5 | c4 | c3 | c2 | c1 |
|---|---|---|---|---|---|---|---|---|---|---|---|
| 3 | a3 | | | | | | | | | | |
| 5 | a7 | a6 | a5 | | | | | | | | |
| 6 | a7 | a6 | | | | | | | | | |
| 7 | a7 | | | | | | | | | | |
| 9 | | | | b1 | a7 | a6 | a5 | a4 | a3 | a2 | a1 |
| 10 | | | | b1 | a7 | a6 | a5 | a4 | a3 | a2 | |
| 11 | | | | b1 | a7 | a6 | a5 | a4 | a3 | | |
| 12 | | | | b1 | a7 | a6 | a5 | a4 | | | |
| 13 | | | | b1 | a7 | a6 | a5 | | | | |
| 14 | | | | b1 | a7 | a6 | | | | | |
| 15 | | | | b1 | a7 | | | | | | |
| 17 | | b3 | b2 | | a7 | a6 | a5 | a4 | a3 | a2 | a1 |
| 18 | | b3 | b2 | | a7 | a6 | a5 | a4 | a3 | a2 | |
| 19 | | b3 | b2 | | a7 | a6 | a5 | a4 | a3 | | |
| 20 | | b3 | b2 | | a7 | a6 | a5 | a4 | | | |
| 21 | | b3 | b2 | | a7 | a6 | a5 | | | | |
| 22 | | b3 | b2 | | a7 | a6 | | | | | |
| 23 | | b3 | b2 | | a7 | | | | | | |
| 24 | | b3 | | | | | | | | | |
| 25 | | | | b3 | a7 | a6 | a5 | a4 | a3 | a2 | a1 |
| 26 | | | | b3 | a7 | a6 | a5 | a4 | a3 | a2 | |
| 27 | | | | b3 | a7 | a6 | a5 | a4 | a3 | | |
| 28 | | | | b3 | a7 | a6 | a5 | a4 | | | |
| 29 | | | | b3 | a7 | a6 | a5 | | | | |
| 30 | | | | b3 | a7 | a6 | | | | | |
| 31 | | | | b3 | a7 | | | | | | |

Fig.10B

| MAX. WORD ROW | e2 | e1 | e0 | d0 | c7 | c6 | c5 | c4 | c3 | c2 | c1 |
|---|---|---|---|---|---|---|---|---|---|---|---|
| 33 | b7 | b6 | b5 | b4 | a7 | a6 | a5 | a4 | a3 | a2 | a1 |
| 34 | b7 | b6 | b5 | b4 | a7 | a6 | a5 | a4 | a3 | a2 |    |
| 35 | b7 | b6 | b5 | b4 | a7 | a6 | a5 | a4 | a3 |    |    |
| 36 | b7 | b6 | b5 | b4 | a7 | a6 | a5 | a4 |    |    |    |
| 37 | b7 | b6 | b5 | b4 | a7 | a6 | a5 |    |    |    |    |
| 38 | b7 | b6 | b5 | b4 | a7 | a6 |    |    |    |    |    |
| 39 | b7 | b6 | b5 | b4 | a7 |    |    |    |    |    |    |
| 40 | b7 | b6 | b5 |    |    |    |    |    |    |    |    |
| 41 |    | b7 | b6 | b5 | a7 | a6 | a5 | a4 | a3 | a2 | a1 |
| 42 |    | b7 | b6 | b5 | a7 | a6 | a5 | a4 | a3 | a2 |    |
| 43 |    | b7 | b6 | b5 | a7 | a6 | a5 | a4 | a3 |    |    |
| 44 |    | b7 | b6 | b5 | a7 | a6 | a5 | a4 |    |    |    |
| 45 |    | b7 | b6 | b5 | a7 | a6 | a5 |    |    |    |    |
| 46 |    | b7 | b6 | b5 | a7 | a6 |    |    |    |    |    |
| 47 |    | b7 | b6 | b5 | a7 |    |    |    |    |    |    |
| 48 |    | b7 | b6 |    |    |    |    |    |    |    |    |
| 49 |    |    | b7 | b6 | a7 | a6 | a5 | a4 | a3 | a2 | a1 |
| 50 |    |    | b7 | b6 | a7 | a6 | a5 | a4 | a3 | a2 |    |
| 51 |    |    | b7 | b6 | a7 | a6 | a5 | a4 | a3 |    |    |
| 52 |    |    | b7 | b6 | a7 | a6 | a5 | a4 |    |    |    |
| 53 |    |    | b7 | b6 | a7 | a6 | a5 |    |    |    |    |
| 54 |    |    | b7 | b6 | a7 | a6 |    |    |    |    |    |
| 55 |    |    | b7 | b6 | a7 |    |    |    |    |    |    |
| 56 |    |    | b7 |    |    |    |    |    |    |    |    |
| 57 |    |    |    | b7 | a7 | a6 | a5 | a4 | a3 | a2 | a1 |
| 58 |    |    |    | b7 | a7 | a6 | a5 | a4 | a3 | a2 |    |
| 59 |    |    |    | b7 | a7 | a6 | a5 | a4 | a3 |    |    |
| 60 |    |    |    | b7 | a7 | a6 | a5 | a4 |    |    |    |
| 61 |    |    |    | b7 | a7 | a6 | a5 |    |    |    |    |
| 62 |    |    |    | b7 | a7 | a6 |    |    |    |    |    |
| 63 |    |    |    | b7 | a7 |    |    |    |    |    |    |

Fig.13A

| MAX. WORD ROW | e2 | e1 | e0 | d0 | c7 | c6 | c5 | c4 | c3 |
|---|---|---|---|---|---|---|---|---|---|
| 3 | a3 | | | | | | | | |
| /////// | /////// | /////// | /////// | /////// | /////// | /////// | /////// | /////// | /////// |
| 5 | | | | z1 | z1 | a3 | a2 | a1 | |
| 6 | | | | z1 | z1 | a3 | a2 | | |
| 7 | | | | z1 | z1 | a3 | | | |
| /////// | /////// | /////// | /////// | /////// | /////// | /////// | /////// | /////// | /////// |
| 9 | | | | b1 | z0 | a3 | a2 | a1 | |
| 10 | | | | b1 | z0 | a3 | a2 | | |
| 11 | | | | b1 | z0 | a3 | | | |
| 12 | | | | b1 | z1 | a3 | a2 | a1 | a0 |
| 13 | | | | b1 | z1 | a3 | a2 | a1 | |
| 14 | | | | b1 | z1 | a3 | a2 | | |
| 15 | | | | b1 | z1 | a3 | | | |
| /////// | /////// | /////// | /////// | /////// | /////// | /////// | /////// | /////// | /////// |
| 17 | | | b3 | b2 | z0 | a3 | a2 | a1 | |
| 18 | | | b3 | b2 | z0 | a3 | a2 | | |
| 19 | | | b3 | b2 | z0 | a3 | | | |
| 20 | | | b3 | b2 | z1 | a3 | a2 | a1 | a0 |
| 21 | | | b3 | b2 | z1 | a3 | a2 | a1 | |
| 22 | | | b3 | b2 | z1 | a3 | a2 | | |
| 23 | | | b3 | b2 | z1 | a3 | | | |
| 24 | | | b3 | | | | | | |
| 25 | | | | b3 | z0 | a3 | a2 | a1 | |
| 26 | | | | b3 | z0 | a3 | a2 | | |
| 27 | | | | b3 | z0 | a3 | | | |
| 28 | | | | b3 | z1 | a3 | a2 | a1 | a0 |
| 29 | | | | b3 | z1 | a3 | a2 | a1 | |
| 30 | | | | b3 | z1 | a3 | a2 | | |
| 31 | | | | b3 | z1 | a3 | | | |

Fig.13B

| MAX. WORD ROW | e2 | e1 | e0 | d0 | c7 | c6 | c5 | c4 | c3 |
|---|---|---|---|---|---|---|---|---|---|
| 33 | b7 | b6 | b5 | b4 | z0 | a3 | a2 | a1 |    |
| 34 | b7 | b6 | b5 | b4 | z0 | a3 | a2 |    |    |
| 35 | b7 | b6 | b5 | b4 | z0 | a3 |    |    |    |
| 36 | b7 | b6 | b5 | b4 | z1 | a3 | a2 | a1 | a0 |
| 37 | b7 | b6 | b5 | b4 | z1 | a3 | a2 | a1 |    |
| 38 | b7 | b6 | b5 | b4 | z1 | a3 | a2 |    |    |
| 39 | b7 | b6 | b5 | b4 | z1 | a3 |    |    |    |
| 40 | b7 | b6 | b5 |    |    |    |    |    |    |
| 41 |    | b7 | b6 | b5 | z0 | a3 | a2 | a1 |    |
| 42 |    | b7 | b6 | b5 | z0 | a3 | a2 |    |    |
| 43 |    | b7 | b6 | b5 | z0 | a3 |    |    |    |
| 44 |    | b7 | b6 | b5 | z1 | a3 | a2 | a1 | a0 |
| 45 |    | b7 | b6 | b5 | z1 | a3 | a2 | a1 |    |
| 46 |    | b7 | b6 | b5 | z1 | a3 | a2 |    |    |
| 47 |    | b7 | b6 | b5 | z1 | a3 |    |    |    |
| 48 |    | b7 | b6 |    |    |    |    |    |    |
| 49 |    |    | b7 | b6 | z0 | a3 | a2 | a1 |    |
| 50 |    |    | b7 | b6 | z0 | a3 | a2 |    |    |
| 51 |    |    | b7 | b6 | z0 | a3 |    |    |    |
| 52 |    |    | b7 | b6 | z1 | a3 | a2 | a1 | a0 |
| 53 |    |    | b7 | b6 | z1 | a3 | a2 | a1 |    |
| 54 |    |    | b7 | b6 | z1 | a3 | a2 |    |    |
| 55 |    |    | b7 | b6 | z1 | a3 |    |    |    |
| 56 |    |    | b7 |    |    |    |    |    |    |
| 57 |    |    |    | b7 | z0 | a3 | a2 | a1 |    |
| 58 |    |    |    | b7 | z0 | a3 | a2 |    |    |
| 59 |    |    |    | b7 | z0 | a3 |    |    |    |
| 60 |    |    |    | b7 | z1 | a3 | a2 | a1 | a0 |
| 61 |    |    |    | b7 | z1 | a3 | a2 | a1 |    |
| 62 |    |    |    | b7 | z1 | a3 | a2 |    |    |
| 63 |    |    |    | b7 | z1 | a3 |    |    |    |

| MAX. WORD ROW | e0 | d0 | c2 | c1 | c0 |
|---|---|---|---|---|---|
| 9 | b3 | b2 | a3 | a2 | a1 |
| 10 | b3 | b2 | a3 | a2 | |
| 11 | b3 | b2 | a3 | | |
| 12 | b3 | | | | |
| 13 | | b3 | a3 | a2 | a1 |
| 14 | | b3 | a3 | a2 | |
| 15 | | b3 | a3 | | |

| MAX. WORD ROW | e0 | d0 | c2 | c1 | c0 | f |
|---|---|---|---|---|---|---|
| 9  | b3 | b2 |    |    | a0 | NC  |
| 10 | b3 | b2 | a3 | a2 | NC | CON |
| 11 | b3 | b2 | a3 |    | NC | CON |
| 12 | b3 |    |    |    |    |     |
| 13 |    | b3 |    |    | a0 | NC  |
| 14 |    | b3 | a3 | a2 | NC | CON |
| 15 |    | b3 | a3 |    | NC | CON |

SEMICONDUCTOR DEVICE

BACKGROUND OF THE INVENTION

The present invention relates to a semiconductor device comprising a memory having X rows or columns, where X is between Nth power of 2 and (N−1)th power of 2, and N is a natural number. In the following, this type memory is called an intermediate word size memory. More particularly, the present invention relates to a semiconductor device equipped with a memory for an intermediate word size that puts out "H (High)" or "L (Low)" as stored data when a row or column having a number larger than X is accessed.

Recently, semiconductor devices equipped with both logic circuits and memories have been used widely for special purposes. FIG. 1 illustrates a block diagram of a semiconductor device equipped with both a logic circuit and memory. A semiconductor device 1 is equipped with a logic circuit 2, a memory 3 accessed by the logic circuit 2, and an input/output circuit 4.

A semiconductor device such as shown in FIG. 1 is usually designed based on the basic circuit configuration developed in advance, and it is modified according to its purpose. Since the required maximum memory capacity is decided depending on the purpose, a memory that will satisfy this requirement is provided accordingly. This decreases the area of the chip used in a semiconductor device, and power dissipation as well. In some cases, a memory to be installed is not replaced, instead only the necessary capacity of the memory is activated according to the required maximum memory. In this case, the area of the chip is not reduced but unwanted power dissipation will be saved.

The size of an address space that can be accessed by N-bit address signals is the Nth power of 2. Typically, a memory has an address space size of Nth power of 2 according to the bit number N of input address signals. This means that there is a memory location corresponding to every address addressed by an address signal. In a semiconductor device, whose memory size can be decided depending on its purpose, the size of a memory address space to be provided or activated may not be equal to the Nth power of 2. For example, a basic memory that can be accessed by 16-bit address signals has a 64 Kbyte address space, and if the maximum space actually used in application is 36 Kbyte, the area and power dissipation of the chip can be reduced by eliminating the part of the memory that corresponds to unused memory space of 28 Kbyte. In this case, this memory is called a memory for an intermediate word size.

However, address signals accessing the deleted addresses may be issued because the address signals are 16-bits. Therefore, the memory for an intermediated word size is designed so as to produce output "H" or "L" as data when such address signals are issued. A semiconductor device having a configuration shown in FIG. 1, is naturally designed to prevent an unequipped or inactivated address space in memory 3 from being accessed by logic circuit 2, and if such invalid accesses, due to a malfunction, occur, they can be detected by an output "H" or "L". Particularly in the performance test during manufacturing process of semiconductor devices such as mentioned above, the same test program is apt to be used for lower cost. In this case, address signals are applied regardless of the size of memory and when such an inexistent address space is accessed constantly, it can be detected by successive outputs "H" or "L". Therefore, it is necessary to design the semiconductor device so that it produces output "H" or "L" as data when such a non-existent address space is accessed.

FIG. 2 illustrates an example of a memory for an intermediate word size configuration. Typically, memory cells have a matrix structure consisting of rows and columns and a memory for an intermediate word size can have either X rows or X columns, or both, where X is between the Nth power of 2 and the (N−1)th power of 2. In the following examples, it is assumed that the number of rows is X, where X is between the Nth power of 2 and the (N−1)th power of 2, because the number of rows is used more frequently. Moreover, though the present invention can be applied to any memory as long as it has memory cells arranged in a matrix form, an SRAM is used as an example here.

The memory for an intermediate word size shown in FIG. 2 is equipped with memory cells 11 having X rows, where X is between the Nth power of 2 and the (N−1)th power of 2, dummy memory cells 12 that produce output "H" or "L" when rows larger than X (surplus address) are accessed, column gate 13, data input/output circuit 14, row address buffer (or row address register) 15, column address buffer (or column address register) 16, row decoder 17, column decoder 18, and surplus address detection circuit 19 that detects accesses to rows larger than X and activates dummy memory cells 12. This memory is the same as the normal memory with the exception of dummy memory cells 12 and surplus address detection circuit 19.

Surplus address detection circuit 19 is a logic circuit to which row address signals sent from row address buffer 15 are supplied, detects accesses to the surplus addresses by logical operation of row address signals, and puts out dummy memory cell activating signals that activate the word line of dummy memory cells 12. Dummy memory cells 12 have the same structure as normal memory cells and the dummy memory cell activating signals are applied to the word line. The nodes of the memory cells (flip-flop) are connected to "H" or "L" so that the stored value is "H" or "L".

As mentioned above, the number of process steps required to manufacture semiconductor devices can be reduced by designing a basic circuit configuration in advance and modifying it according to an individual purpose. It is preferable if the modification is minor, however, the maximum word row can be specified for any given number X between the Nth power of 2 and the (N−1)th power of 2 in a memory for an intermediate word size, and it is required for surplus address detection circuit 19 to detect accesses to addresses (surplus address) larger than the specified maximum word row number X. Therefore, there can be diverse surplus address detection circuits according to the maximum word row number X, and each surplus address detection circuit has been designed separately to meet the maximum word row number, resulting in excessive process steps.

On the other hand, a layout space for the surplus address detection circuit is generally limited and a smaller area for the circuit is preferable. This prevents surplus address detection circuit 19 from accepting all row address signals, and is a factor that has impeded the development of a general purpose surplus address detection circuit that can be used for diverse maximum word row numbers.

SUMMARY OF THE INVENTION

The present invention aims at the development of a smaller surplus address detection circuit for various purposes that can be used for diverse maximum word row numbers in semiconductor devices equipped with a memory for an intermediate word size by solving these problems.

For this purpose, the surplus address detection circuit is designed so as to detect accesses to surplus addresses by outputs of pre-decoders, which are constituents of the decoder, and only a part of the outputs of plural pre-decoders is supplied to the surplus address detection circuit.

The semiconductor device of the present invention, which comprises a memory for an intermediate word size having X rows or columns, where x is between the Nth power of 2 and the (N−1)th power of 2 and N is a natural number, an address decoder that decodes address signals indicating row or column locations of the memory for an intermediate word size to be accessed, and a surplus address detection circuit that detects accesses by address signals to surplus addresses larger than X, is characterized in that: the address decoder comprises plural pre-decoders that decode address signals classified into plural smaller groups and a post-decoder that generates signals that select a row or column to be accessed by a combination of outputs from the plural pre-decoders; and the surplus address detection circuit detects accesses to surplus addresses larger than X by outputs of the plural pre-decoders and has the number of input signal lines of the surplus address detection circuit, fewer than that of outputs of the plural pre-decoders.

When the number of address signals is large, it is generally true that an address decoder in memory is comprised of plural pre-decoders that decode address signals classified into several smaller groups and a post-decoder that generates signals that select a row or column to be accessed by a combination of outputs of the plural pre-decoders. In the present invention, the surplus address detection circuit detects accesses surplus addresses by outputs of the pre-decoders. This leads to the development of general purpose surplus address detection circuits that can be used commonly for diverse maximum word row numbers. Moreover, it is possible to detect accesses to surplus addresses without using all the outputs of the plural pre-decoders.

The surplus address detection circuit is equipped with a selection circuit that selects outputs to be used to detect accesses to surplus addresses out of the outputs of plural pre-decoders and a surplus address detection logic circuit that detects accesses to surplus addresses by the pre-decoder outputs selected by the selection circuit. The surplus address detection logic circuit retains the same circuit configuration, regardless of number X and it is possible to adjust the surplus address detection logic circuit according to number X only by selecting plural pre-decoder outputs in the selection circuit.

The area of the selection circuit can be reduced because it can be designed so that only a part of the plural pre-decoder outputs is supplied to the selection circuit, resulting in a reduction of the number of wires.

The selection circuit is equipped with intersections of signal lines of plural pre-decoder outputs and signal lines of inputs to the surplus address detection circuit, and connection contacts between signal lines at the intersects, and can select outputs of the pre-decoders to be supplied to the surplus address detection circuit by selecting patterns of the connection contact according to number X.

BRIEF DESCRIPTION OF THE DRAWINGS

The features and advantages of the invention will be more clearly understood from the following description taken in conjunction with the accompanying drawings in which:

FIGS. 7A and 7B illustrate an example of contact patterns in the first embodiment;

FIGS. 10A and 10B illustrate an example of contact patterns in the second embodiment;

FIGS. 13A and 13B illustrate an example of contact patterns in the third embodiment;

DESCRIPTION OF THE PREFERRED EMBODIMENTS

Figure 3:
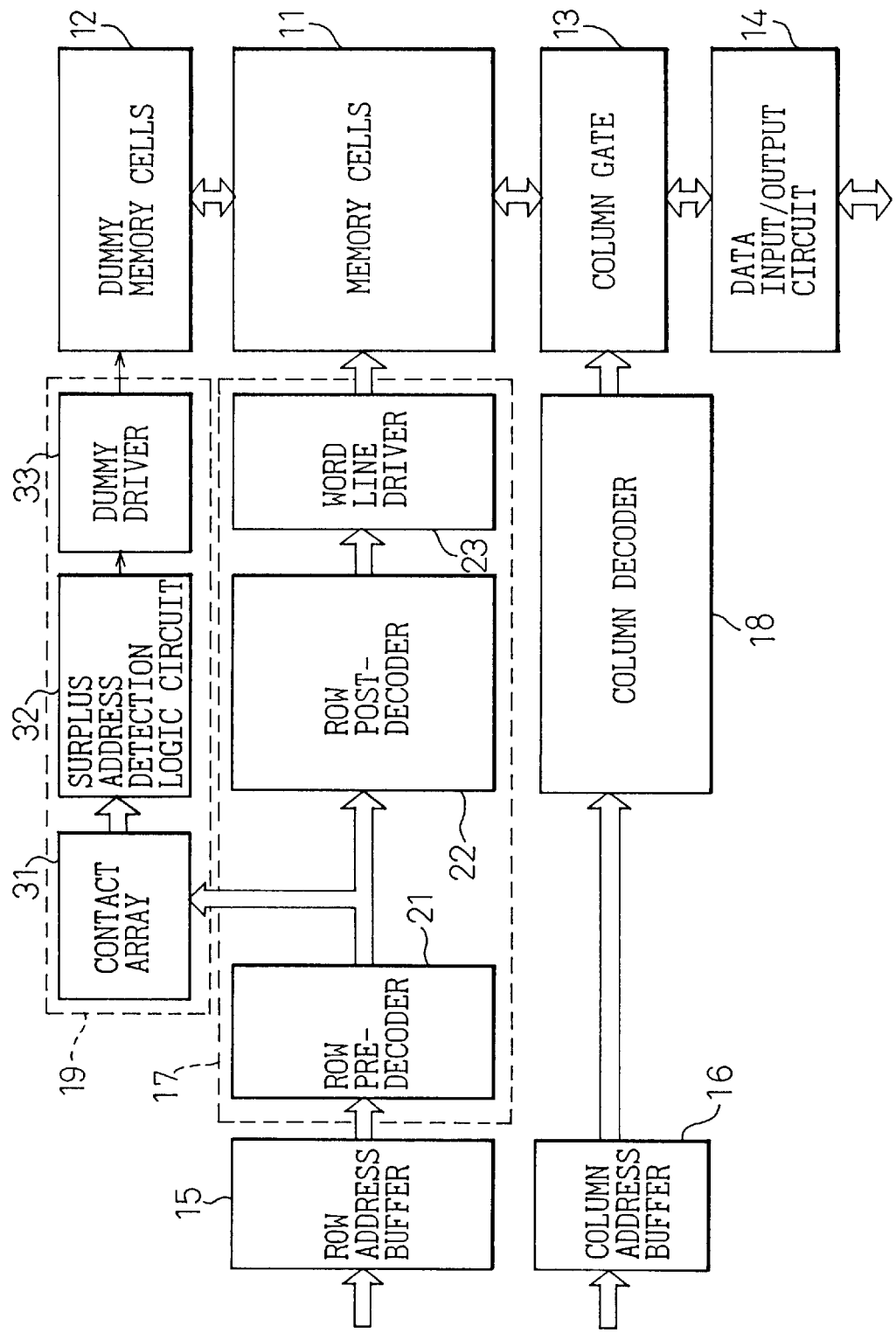
FIG. 3 illustrates an example of configuration of the memory for an intermediate word size in the first embodiment of the present invention.

FIG. 3 illustrates the configuration of the memory for an intermediate word size in the first embodiment of the present invention. Embodiments other than the first one have the same configuration as that shown in FIG. 3.

Figure 1:
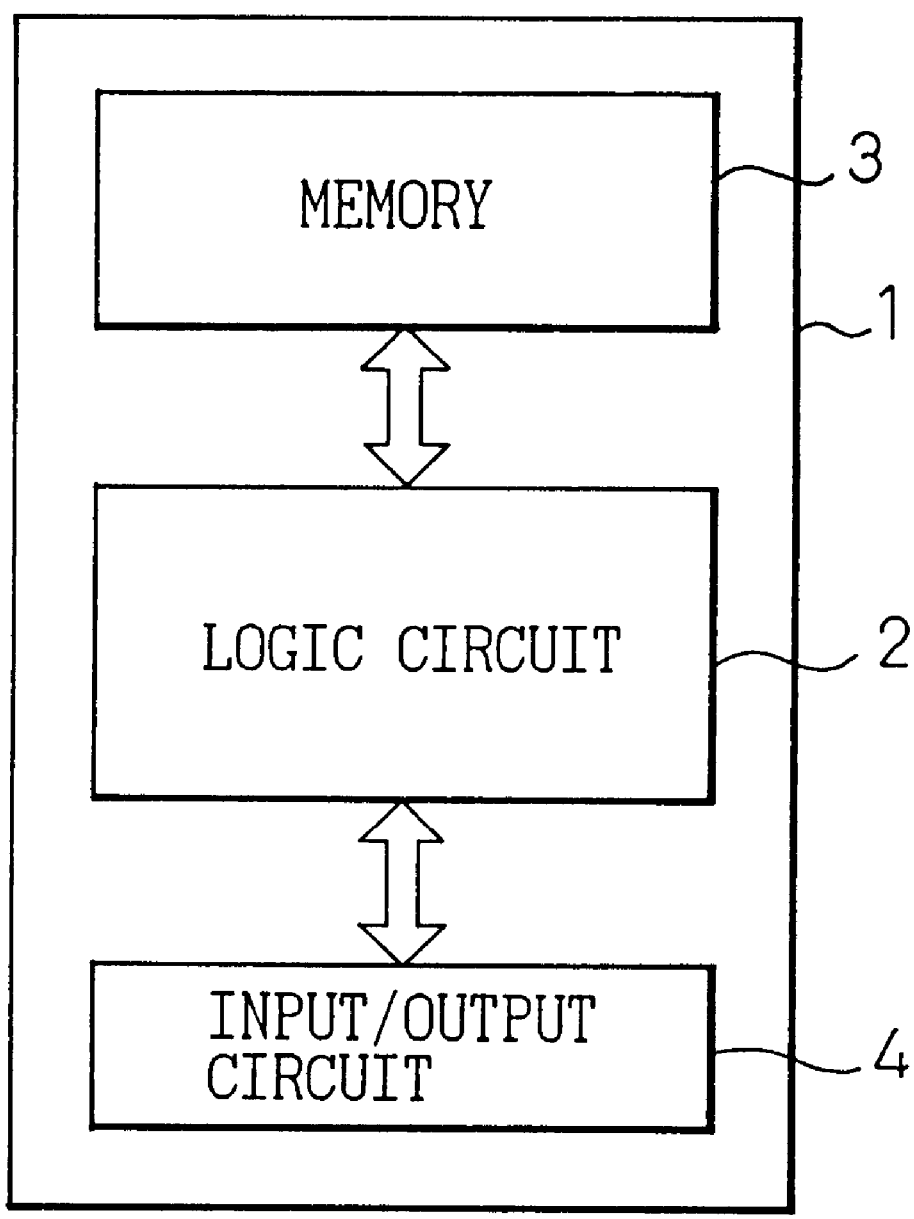
FIG. 1 illustrates a system IC configuration having a memory as an example of a semiconductor device equipped with a memory for an intermediate word size.
Figure 2:
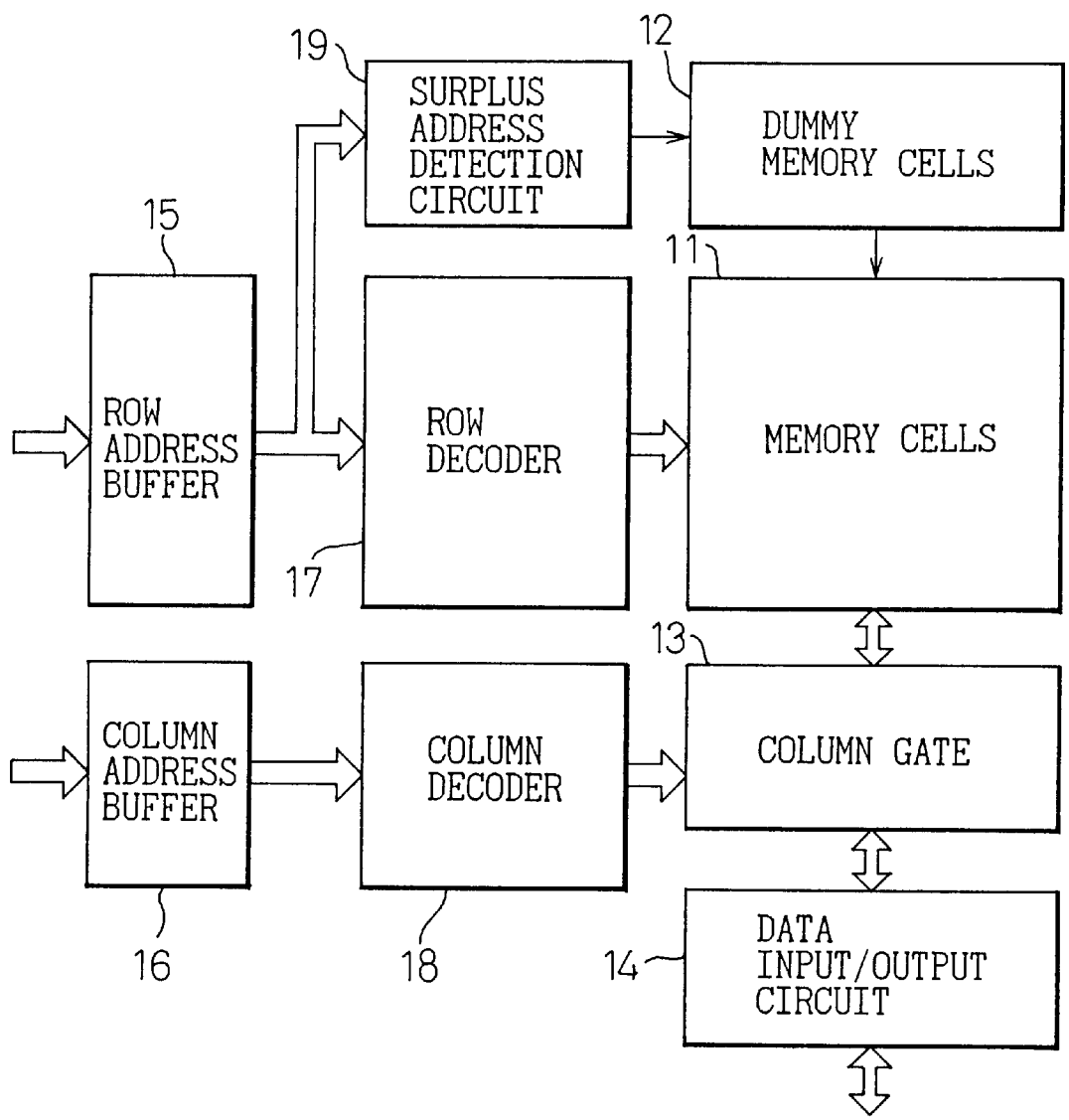
FIG. 2 illustrates an example of configuration of a memory for an intermediate word size.

As shown in FIG. 3, the memory for an intermediate word size in the first embodiment has the same configuration as the conventional one shown in FIG. 2 with the exception of the surplus address detection circuit 19. Though not shown here, the row decoder 17 comprises a row pre-decoder 21, a row post-decoder 22, and a word line driver 23, and it is the same as the conventional one. The only the difference lies in the surplus address detection circuit 19, to which the outputs of row pre-decoder 21 are supplied. Moreover, the surplus address detection circuit 19 comprises a contact array 31, a surplus address detection logic circuit 32, and a dummy driver 33. The contact array 31 selects the outputs which are to be supplied to the surplus address detection logic circuit 32 from the outputs of the row pre-decoder 21, and changes signals to be selected according to the maximum word row number. The Surplus address detection logic circuit 32 retains the same circuit configuration regardless of the maximum word row number. Surplus address detection and related matters are described below.

Figure 4:
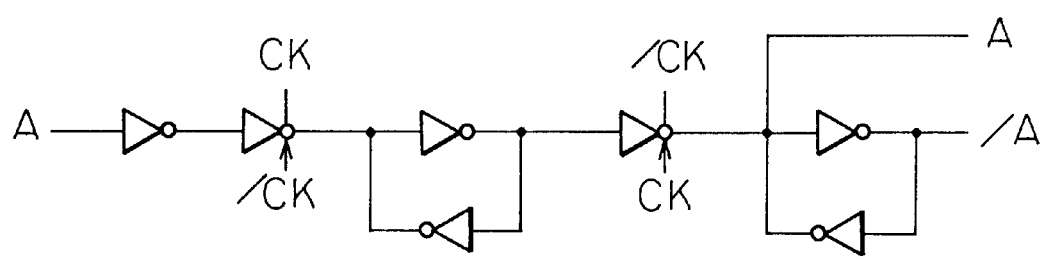
FIG. 4 illustrates an example of an address buffer circuit.

FIG. 4 illustrates an example of an address buffer circuit, and circuits equal in number to that of address signals are attached to row address buffer 15 and column address buffer 16. This address buffer circuit latches address signal A according to clock signals CK and /CK, and produces outputs of complementary signals A and /A. Here, an explanation of this address buffer will be abbreviated since it is widely used.

Figure 5:
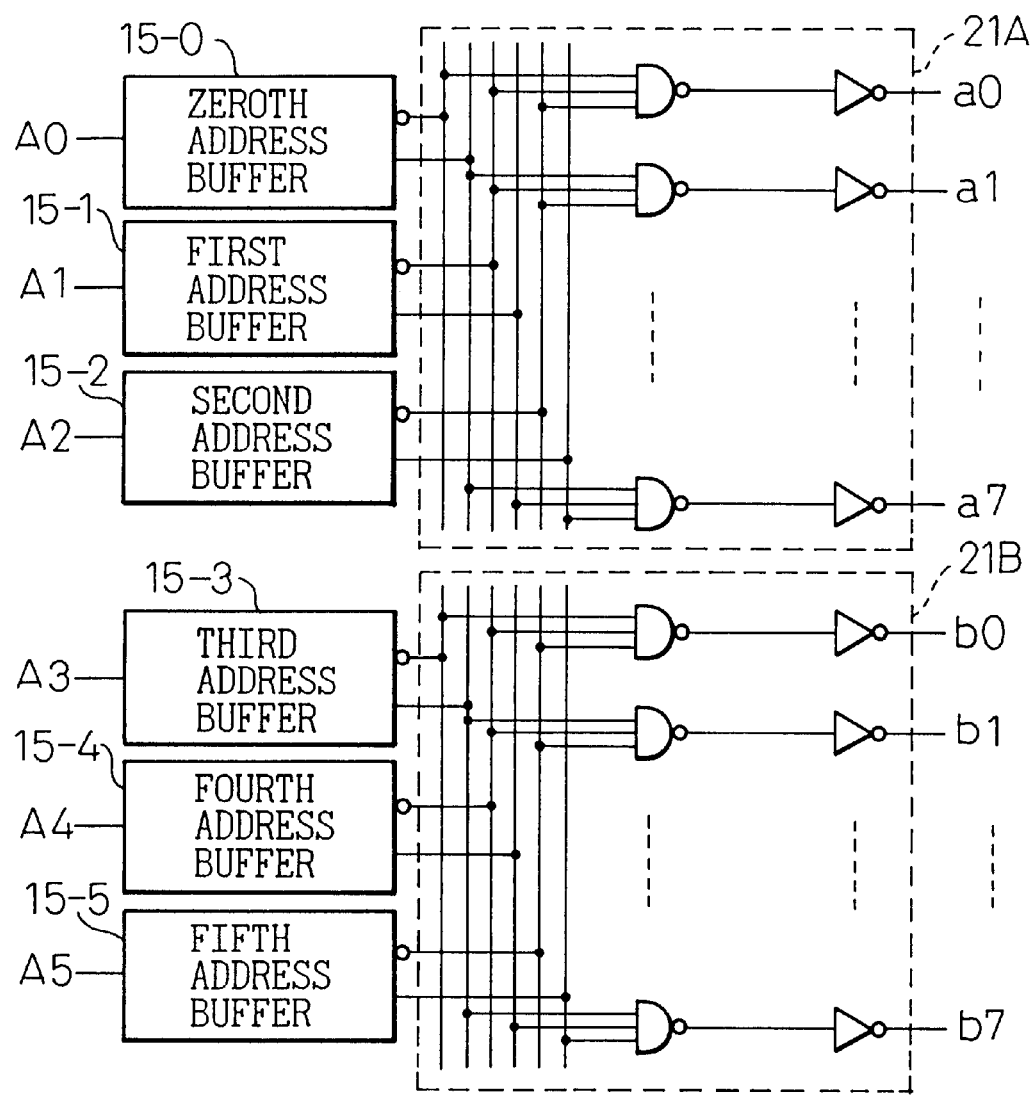
FIG. 5 illustrates an example of address buffers and row pre-decoder circuit.

FIG. 5 illustrates an example of a circuit consisting of row address buffer 15 and row pre-decoder 21. In the first embodiment, the row address signal is 6-bit, and row address buffer 15 has six address buffers 15-0 to 15-5 as shown in FIG. 5. The row pre-decoder 21 has a lower pre-decoder 21A that decodes outputs of address buffers 15-0 to 15-2 for the lower three bits, and an upper pre-decoder 21B that decodes outputs of address buffers 15-3 to 15-5 for the upper three bits. The lower pre-decoder 21A decodes outputs of address buffers 15-0 to 15-2 and puts out eight decoded signals a0 to a7, and the upper pre-decoder 21B decodes outputs of address buffers 15-3 to 15-5 and puts out eight decoded signals b0 to b7. The row post-decoder 22 generates access signals for each word line of memory cells 11 using decoded signals a0 to a7 and b0 to b7. For example, a circuit for providing the logical AND or logical NAND of a0 and b0 is provided and its outputs are applied to the part that drives the word line of the zeroth row of word line driver 23. Similarly, a circuit for the logical ANDing or NANDing of a1 and b1 and its outputs are applied to the part that drives the word line of the first row of word line driver 23.

Figure 6:
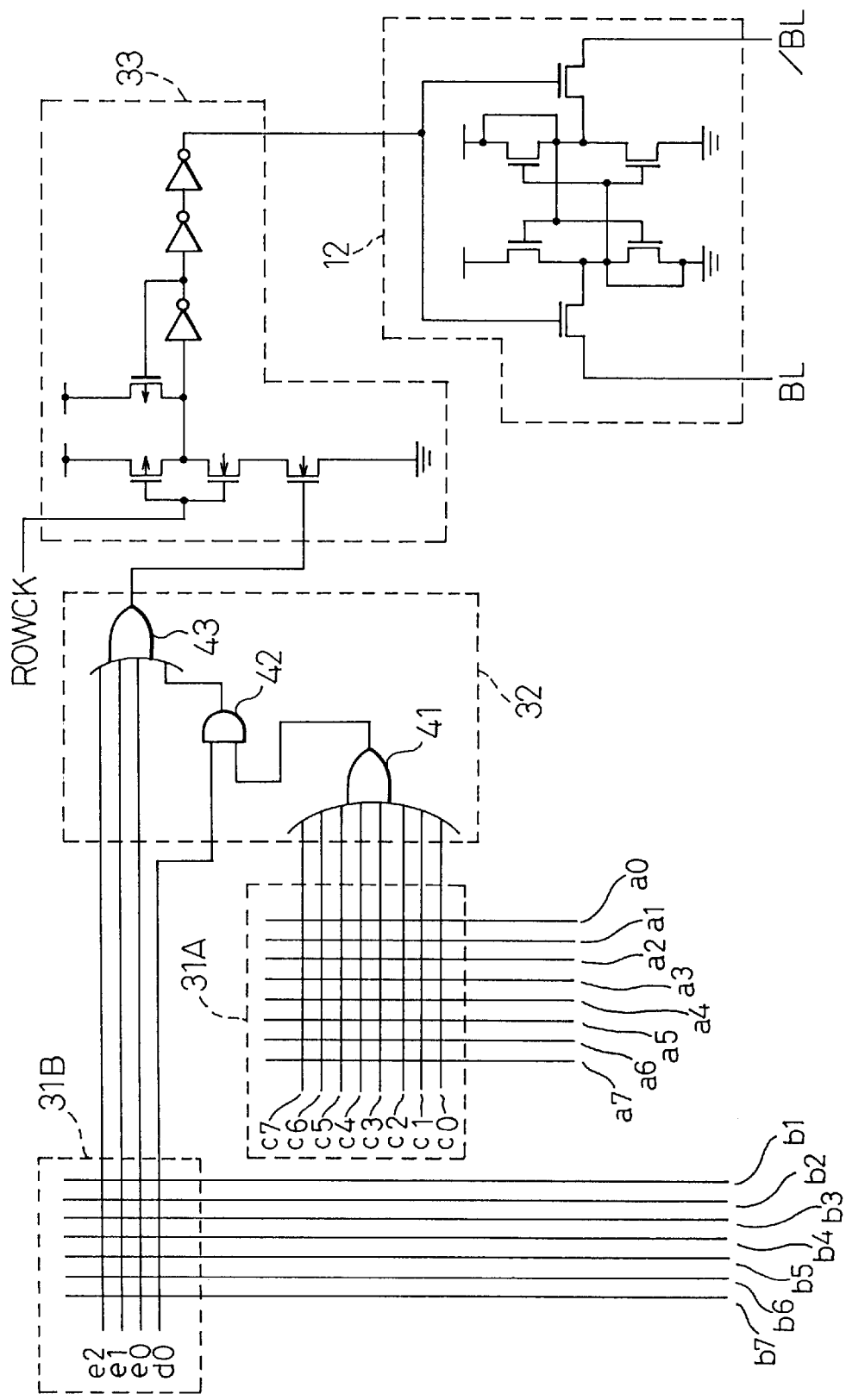
FIG. 6 illustrates the configuration of the surplus address detection circuit and dummy memory cells in the first embodiment.

FIG. 6 illustrates the circuit configuration of surplus address detection circuit 19 and dummy memory cells 12 in the first embodiment. Contact array 31 consists of the first contact array 31A and the second contact array 31B. At the first contact array 31A, lines of decoded signals a0 to a7 and input signals c0 to c7 supplied to surplus address detection logic circuit 32 intersect and it selects the signal lines to be connected, and at the second contact array 31B decoded signals b0 to b7 and input signals d0 and e0 to e2 supplied to surplus address detection logic circuit 32 intersect and it selects the signal lines to be connected. At the first contact array 31A and the second contact array 31B, signal lines that are connected each other can be selected in the manufacturing process by designing the mask patterns. Though not shown here, input signals c0 to c7, d0, and e0 to c2, which are not connected to decoded signals a0 to a7 or b0 to b7, can be connected to the "L" level.

The surplus address detection logic circuit 32 consists of OR gate 41 that accepts signals c0 to c7, AND gate 42 that accepts signal d0 and outputs of OR gate 41, and OR gate 43 that accepts signals e0 to c2 and outputs of AND gate 42. The output of OR gate 43 is "H" when surplus addresses are accessed, and "L" when other addresses (word row of memory cells 11) are accessed.

The dummy driver 33 has the same circuit configuration as one of the driver circuits of word line driver 23. When the output of OR gate 43 is applied to the gate of the N-channel transistor, the output of OR gate 43 becomes "H", row clock signal ROWCK becomes "H", and the output of the inverter in the final stage becomes "H". This output is applied to the word line of dummy memory cells 12 and the value of dummy memory cells 12 is sent to the bit line pair BL and /BL. Though dummy memory cells 12 have a memory cell configuration (flip-flop) the same as a normal SRAM, one of the nodes of the memory cells is fixed to "H" and the other node to "L", and "L" and "H" are constantly sent to the bit line pair BL and /BL, respectively.

The surplus address detection circuit in FIG.6 can detect accesses to surplus addresses for any maximum word row number by selecting connections at the first contact array 31A and the second contact array 31B according to the maximum word row number.

FIGS. 7A and 7B illustrate a table that indicates connections (contact patterns) at the first contact array 31A and the second contact array 31B when the maximum word row number is 3 to 63. Blank parts indicate that signals c0 to c7, d0, and e0 to c2 are connected to the "L" level.

In FIGS. 7A and 7B, the maximum word rows 4, 8, and 16 are shaded diagonally because these maximum word rows correspond to Nth power of 2, where N is a natural number, and in this case inputs of address signals are limited, so surplus address detection circuit is not necessary. This applies when the maximum word rows are 1, 2, and 32.

When the maximum word row is 28, for example, c4 to c7 and d0 are connected to a4 to a7 and b3 respectively, and c0 to c3 and e0 to e2 are connected to the "L" level. Therefore, when one of the word lines between row 29 and row 64 is accessed, the output of OR gate 43 becomes "H" and dummy memory cells 12 are accessed. Similarly, when the maximum word row is 54, for example, c6, c7, d0, and e0 are connected to a6, a7, b6, and b7 respectively, and c0 to c5, e1, and e2 are connected to the "L" level. Therefore, when one of the word lines between row 55 and row 64 is accessed, the output of OR gate 43 becomes "H" and dummy memory cells 12 are accessed.

In the first embodiment, accesses to surplus addresses are detected by the surplus address detection logic circuit 32 and the output of the surplus address detection logic circuit 32, which is the result of the decision, is applied to the gate of an N-channel transistor mounted on dummy driver 33. However, the row post-decoder 22 and the word line driver 23 have common parts, and such a configuration can be expected in the first embodiment because it is common that word line driver 23 is equipped with a part of the logical operation function of row post-decoder 22.

Figure 8:
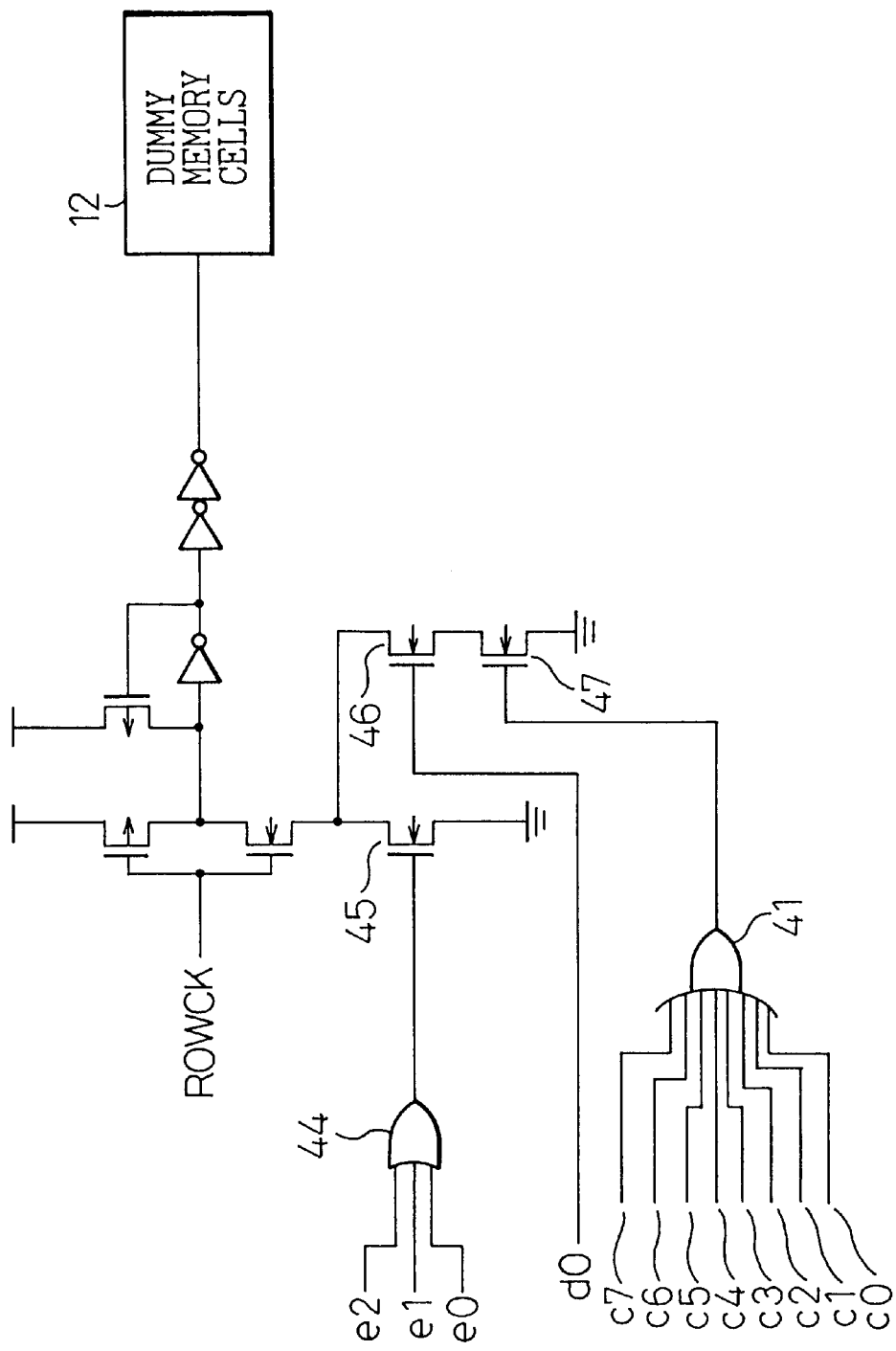
FIG. 8 illustrates an example of modification of the surplus address detection logic circuit and the dummy cell driver in the first embodiment.

FIG. 8 illustrates a modified example of dummy driver 33 equipped with a part of the logical operation function of surplus address detection logic circuit 32 in the first embodiment. As shown in the figure, N-channel transistor 45 is equipped in parallel with two N-channel transistors 46 and 47 connected in series. Signal d0 is applied to the gate of N-channel transistor 46 and the output of OR gate 41 is applied to the gate of N-channel transistor 47. Because N-channel transistors 46 and 47 are connected in series, they will operate in the same way as AND gate 42. Since the two N-channel transistors 46 and 47 connected in series are connected in parallel to N-channel transistor 45, they function to output an OR of outputs of an OR gate 44 and the OR gate 41. That is, a logic circuit configuration equivalent to that in FIG. 6 is constructed. Though there can be such modifications in the following embodiments, only examples in which every logical operation is carried out in the surplus address detection logic circuit will be described here for simplicity.

In the first embodiment, 15 outputs, a0 to a7 and b1 to b7 among 16 outputs of row pre-decoder are supplied to contact array 31, and there are 12 signal lines of surplus address detection logic circuit 32. To reduce the area of the circuit, it is essential to reduce the number of 16 outputs of row pre-decoder, which are supplied to contact array 31, and the number of signal lines of surplus address detection logic circuit 32 as well. The second embodiment is an example in which such reduction has been carried out.

Figure 9:
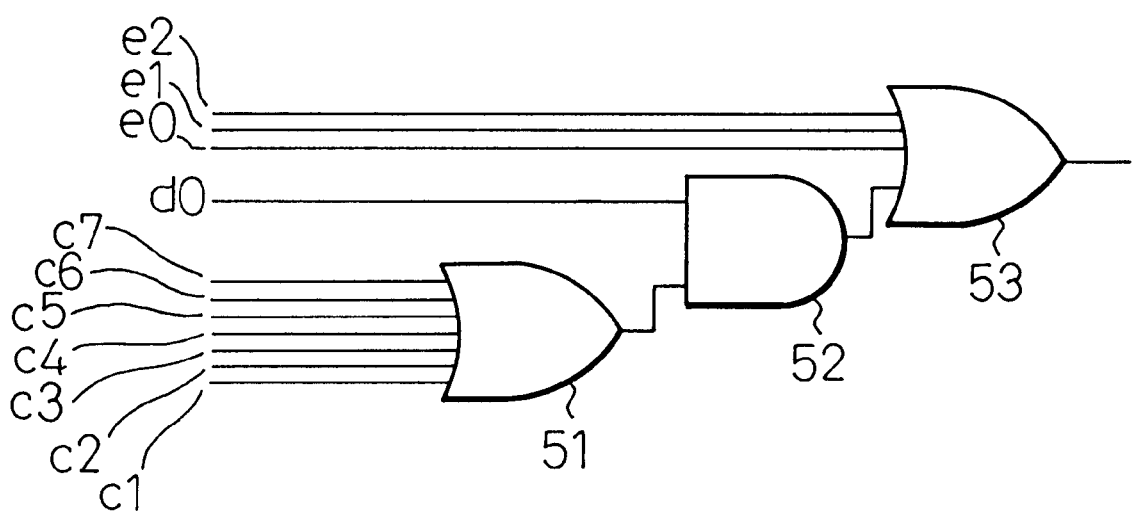
FIG. 9 illustrates the surplus address detection logic circuit in the second embodiment of the present invention.

FIG. 9 illustrates the surplus address detection logic circuit in the second embodiment. Other parts have the same configuration as that of the example in the first embodiment. FIGS. 10A and 10B illustrate the table of contact patterns for the contact array in the second embodiment. As shown in the figure, there are 11 signal lines of the surplus address detection logic circuit. This is less than in the first embodiment by one line. Moreover, as shown in FIGS. 10A and 10B, there are 14 outputs, a1 to a7 and b1 to b7 among 16 outputs of row pre-decoder that are supplied to the contact array. This is less than in the first embodiment by one output.

Figure 11:
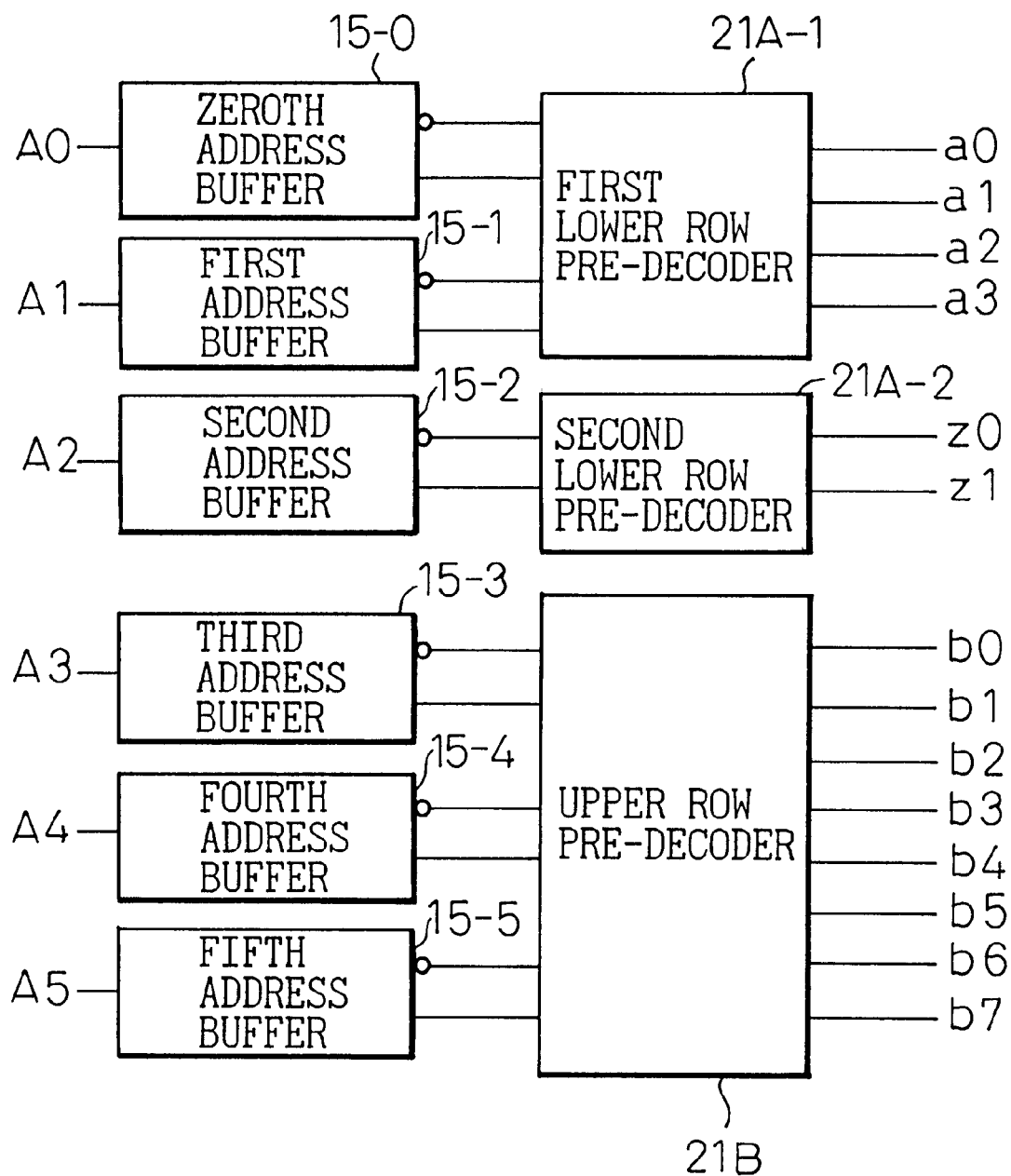
FIG. 11 illustrates an example of row pre-decoders in the third embodiment of the present invention.

FIG. 11 illustrates the configuration of the row pre-decoder in the third embodiment. In the first embodiment, the row pre-decoder is comprised of lower pre-decoder 21A that decodes row address signals A0 to A2, and upper pre-decoder 21B that decodes row address signals A3 to A5. In the third embodiment, however, the row pre-decoder is composed of the first lower pre-decoder 21A-1 that decodes row address signals A0 and A1, the second lower pre-decoder 21A-2 that decodes row address signal A2, and upper pre-decoder 21B that decodes row address signals A3 to A5. Therefore, the first lower pre-decoder 21A-1 produces outputs of decoded signals a0 to a3, the second lower pre-decoder 21A-2 produces outputs of decoded signals z0 and z1, and upper pre-decoder 21B produces outputs of decoded signals b0 to b7.

Figure 12:
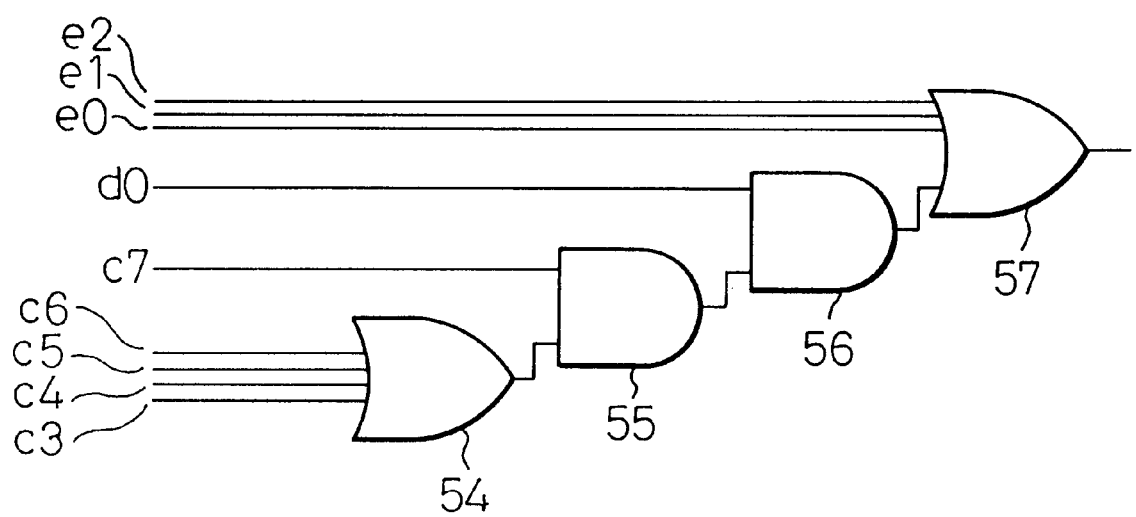
FIG. 12 illustrates the surplus address detection logic circuit in the third embodiment.

FIG. 12 illustrates the surplus address detection logic circuit in the third embodiment. Other parts have the same configuration as the example in the first embodiment. FIGS. 13A and 13B illustrate the table of contact patterns for the contact array in the third embodiment. As shown in the figure, there are nine signal lines of the surplus address detection logic circuit. This is less than in the first embodiment by three lines. Moreover, as shown in FIGS. 13A and 13B, there are 13 outputs, a0 to a3, z0, z1 and b1 to b7 among outputs of row pre-decoder that are supplied to the contact array. This is less than in the first embodiment by two outputs.

As explained thus far, the number of signal lines of the surplus address detection logic circuit and the number of decode signals supplied to the contact array can be reduced in the second and third embodiments, compared to the first embodiment, therefore, the area of the surplus address detection circuit can be reduced.

Examples in which the row address is 6-bits have been shown in the first, second and third embodiments so far, but here, examples in which the present invention is applied to other cases when the bit number is other than six. The memory for an intermediate word size in the fourth embodiment has the same configuration as that in the first embodiment, with the exception of the row pre-decoder and surplus address detection logic circuit.

Figure 14:
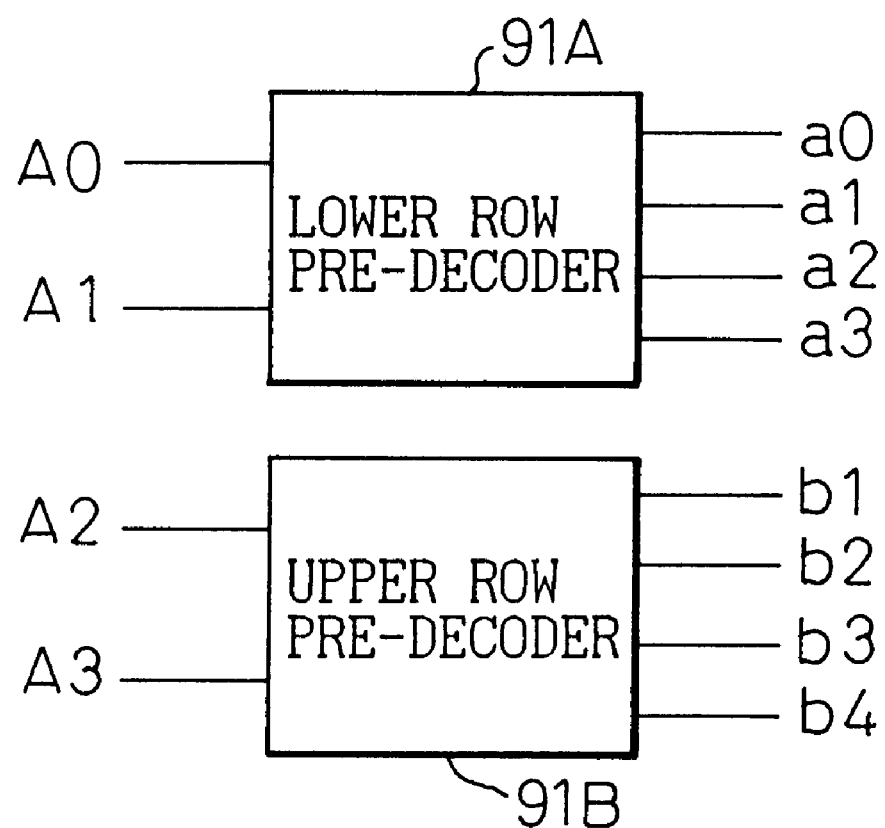
FIG. 14 illustrates the row pre-decoders in the fourth embodiment of the present invention.

FIG. 14 illustrates the configuration of the row pre-decoder in the fourth embodiment of the present invention. As shown in the figure, the row address is 4-bits in the fourth embodiment, and lower row pre-decoder 91A decodes row address signals A0 and A1, upper row pre-decoder 91B decodes row address signals A2 and A3, respectively, and they produce outputs of decoded signals a0 to a3 and b0 to b3.

Figures 15, 16:
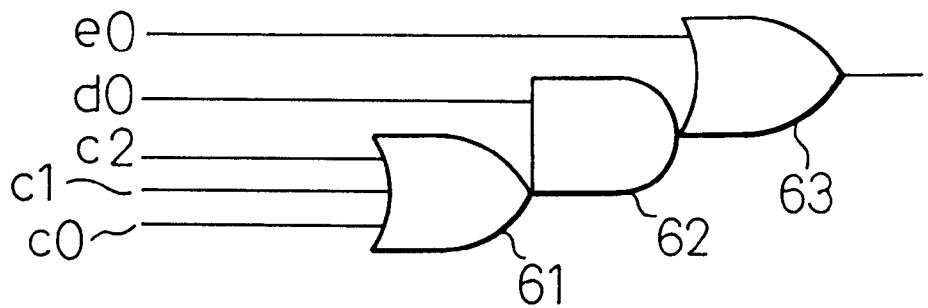
FIG. 15 illustrates the surplus address detection logic circuit in the fourth embodiment.
FIG. 16 illustrates an example of contact patterns in the fourth embodiment.

FIG. 15 illustrates the surplus address detection logic circuit in the fourth embodiment. FIG. 16 illustrates the table of contact patterns for the contact array in the fourth embodiment. In the fourth embodiment, use of a small capacity, where the maximum word row is between one and eight, is not taken into account and, instead it is assumed that the maximum word row is nine at least.

As shown in the figure, there are five signal lines of the surplus address detection logic circuit and only five outputs, a1 to a3, b2 and b3 among outputs of the row pre-decoder, are supplied to the contact array.

Figures 17, 18:
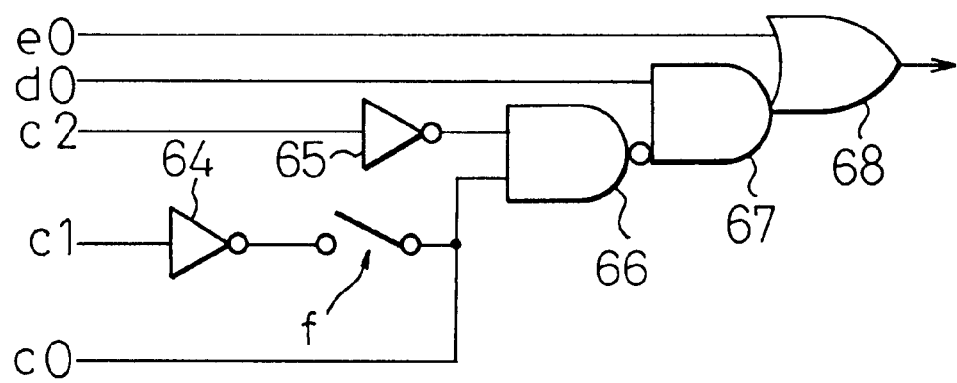
FIG. 17 illustrates the surplus address detection logic circuit in the fifth embodiment of the present invention.
FIG. 18 illustrates an example of contact patterns in the fifth embodiment.

FIG. 17 illustrates the surplus address detection logic circuit in the fifth embodiment of the present invention. FIG. 18 illustrates the table of contact patterns for the contact array in the fifth embodiment. In the fifth embodiment, the row address is 4-bits, the same as in the fourth embodiment, and the pre-decoder has the same configuration as that in the fourth embodiment shown in FIG. 14. In the fifth embodiment also, it is assumed that the maximum word row is nine at least.

As shown in the figure, there are five signal lines of the surplus address detection logic circuit, and contact f is equipped to select an input to the one of NAND gate 66 between signals c0 and inverted c1. It is necessary to set the contact patterns including this contact f. Only five outputs, a0, a2, a3, b2, and b3 among outputs of the row pre-decoder are supplied to the contact array.

We have explained the first through the five embodiments thus far, but the present invention can be applied to other cases when the number of row address is different, and there can be diverse modified examples according to each number of the row address. There also can be diverse modified examples of the row pre-decoder and the surplus address detection logic circuit, and the contact patterns will change accordingly.

The present invention, as explained thus far, can reduce the designing process steps, costs, and read time depending on the specified capacity of the memory for an intermediate word size, because the surplus address detection circuit needs a smaller area for layout and it can be used commonly according to the maximum word row number, in each case, in a semiconductor device equipped with the memory for an intermediate word size.

We claim:

1. A semiconductor device comprising a memory having X rows or X columns, where X is between Nth power of 2 and (N−1)th power of 2, and N is an natural number, an address decoder that decodes an address signal addressing rows or columns of said memory for an intermediate word size to be accessed, and a surplus address detection circuit that detects accesses to addresses larger than said X by the said address signal, wherein:

said address decoder is equipped with plural pre-decoders that decode the address signals classified into plural groups, and a post-decoder that generates a selection signal to select a row or column to be accessed by combining the outputs of said plural pre-decoders;

said surplus address detection circuit detects accesses to addresses larger than said X by the outputs of said plural pre-decoders; and the number of input signals of said surplus address detection circuit is smaller than that of outputs of said plural pre-decoders.

2. A semiconductor device as set forth in claim 1, wherein:

said surplus address detection circuit is equipped with a selection circuit that selects outputs to be used to detect accesses to said surplus addresses from among outputs of said plural pre-decoders, and a surplus address detection logic circuit that detects accesses to said surplus address by the outputs of said plural pre-decoders, said outputs being selected by said selection circuit; and said address detection logic circuit retains the same circuit configuration regardless of said number X, and settings according to said number X can be carried out only with the selection of outputs of said plural pre-decoders by said selection circuit.

3. A semiconductor device as set forth in claim 2, wherein:

only a part of the outputs of said plural pre-decoders is supplied to the said selection circuit.

4. A semiconductor device as set forth in claim 2, wherein: said selection circuit is equipped with intersections of signal lines of outputs of said plural pre-decoders and signal lines of inputs of said surplus address detection circuit, and a connection contact for the signal lines at said intersections, and the pattern of said connection contacts can be selected according to the said number X.

* * * * *